(12) United States Patent
Hobelsberger et al.

(10) Patent No.: US 8,396,677 B2
(45) Date of Patent: Mar. 12, 2013

(54) METHOD FOR MONITORING THE SHAFT CURRENT AND/OR THE INSULATION OF THE SHAFT OF ELECTRIC MACHINES AND DEVICE FOR PERFORMING THE METHOD

(75) Inventors: Max Hobelsberger, Wuerenlingen (CH); Zlatimir Posedel, Neuenhof (CH)

(73) Assignee: Alstom Technology Ltd., Baden (CH)

( * ) Notice: Subject to any disclaimer, the term of this patent is extended or adjusted under 35 U.S.C. 154(b) by 0 days.

(21) Appl. No.: 12/795,491

(22) Filed: Jun. 7, 2010

(65) Prior Publication Data
US 2010/0299090 A1 Nov. 25, 2010

Related U.S. Application Data

(63) Continuation of application No. PCT/EP2008/066872, filed on Dec. 5, 2008.

(30) Foreign Application Priority Data

Dec. 7, 2007 (CH) ...................................... 1895/07

(51) Int. Cl.
*G01R 31/34* (2006.01)
(52) U.S. Cl. ......................................................... 702/58
(58) Field of Classification Search .................... 702/58, 702/57, 183; 1/58; 324/500
See application file for complete search history.

(56) References Cited

U.S. PATENT DOCUMENTS

| 3,831,160 A | 8/1974 | Cronin et al. |
| 4,147,982 A | 4/1979 | Emery |
| 4,831,295 A * | 5/1989 | Posedel ........................ 310/72 |
| 5,006,769 A | 4/1991 | Posedel |
| 5,796,262 A | 8/1998 | Bice |
| 6,300,701 B1 * | 10/2001 | Ong et al. ..................... 310/179 |
| 6,460,013 B1 * | 10/2002 | Nippes ........................... 702/183 |
| 7,649,470 B2 * | 1/2010 | Hobelsberger et al. ....... 340/679 |
| 2005/0200378 A1 * | 9/2005 | Hobelsberger et al. ....... 324/772 |

FOREIGN PATENT DOCUMENTS

| EP | 0 391 181 | 10/1990 |
| WO | WO 97/30359 A1 | 8/1997 |
| WO | WO 2004/025316 A1 | 3/2004 |
| WO | WO 2006/134068 | 12/2006 |

OTHER PUBLICATIONS

International Search Report dated Apr. 21, 2009.
Swiss Search Report dated Mar. 12, 2008 (with English language translation of category of cited documents).
Michael L. Costello, "Shaft Voltages & Rotating Machinery", Petroleum and Chemical Industry Conference, Sep. 9, 1991, pp. 71-78, XP-010053131.

(Continued)

*Primary Examiner* — Bryan Bui
(74) *Attorney, Agent, or Firm* — Buchanan Ingersoll & Rooney PC

(57) ABSTRACT

A method is disclosed for monitoring shaft current ($I_w$) and/or insulation of the shaft of an electrodynamic machine, wherein susceptibility to interference can be reduced. A shaft voltage ($U_w$) and associated shaft current ($I_w$) are measured, and a relationship is determined from measurement results for the shaft voltage ($U_w$) and the shaft current ($I_w$) for the electrodynamic machine. The shaft voltage ($U_w$) can be monitored to monitor the shaft current ($I_w$), the shaft current ($I_w$) being deduced from the monitored shaft voltage ($U_w$) based on a determined relationship between the shaft voltage ($U_w$) and the associated shaft current ($I_w$).

17 Claims, 2 Drawing Sheets

OTHER PUBLICATIONS

Raymond Ong et al, "A Comparison of Techniques for Measurement of Shaft Currents in Rotating Machines", IEEE Transaction on Energy Conversion, vol. 12, No. 4, Dec. 1997, pp. 363-367, XP-011015503.

R.F. Schiferl et al., "Inverter Driven Induction Motor Bearing Current Solutions", Industry Applications Society 49th Annual Petroleum and Chemical Indstry Conference (PCIC), Sep. 23-25, 2002, vol. conf. 49, Sep. 23, 2002, pp. 67-75, XP-010611378.

* cited by examiner

METHOD FOR MONITORING THE SHAFT CURRENT AND/OR THE INSULATION OF THE SHAFT OF ELECTRIC MACHINES AND DEVICE FOR PERFORMING THE METHOD

RELATED APPLICATIONS

This application claims priority as a continuation application under 35 U.S.C.§120 to PCT/EP2008/066872, which was filed as an International Application on Dec. 5, 2008 designating the U.S., and which claims priority to Swiss Application 01895/07 filed in Switzerland on Dec. 7, 2007. The entire contents of these applications are hereby incorporated by reference in their entireties.

FIELD

The present disclosure relates to the field of electrical machines, such as methods and devices for monitoring the shaft current and/or the insulation of the shaft of electrodynamic machines during operation.

BACKGROUND INFORMATION

During operation of electrodynamic machines, for example large generators or motors, electrical voltages occur between the shaft and the housing or ground. The shaft can be grounded at one end of the machine. The shaft is therefore isolated from ground at the other end of the machine, because of the voltages which occur. Insulated bearings, for example, are used for this purpose.

If this isolation is electrically conductively bridged because of component faults, and so forth, electric currents flow in the shaft which can damage the shaft and adjacent components such as the bearings.

There is therefore a desire to detect the occurrence of such insulation faults and currents in order then to protect the machine against more extensive damage, by suitable measures.

It is known from the prior art (see for example the document U.S. Pat. No. 6,300,701) for the shaft current to be measured by a Rogowski coil which is arranged around the shaft, and for the shaft current to be monitored for a predetermined maximum value. An appropriate warning alarm is triggered if this predetermined value is exceeded.

Similar solutions based on induction coils are used in commercially available appliances (for example the "RARIC" system from the ABB Company or the "DRS Compact2A" system from the VA Tech SAT Company).

In the abovementioned methods and apparatuses, the induction coils or Rogowski coils do not operate ideally and can also produce signals which do not originate from the current through the shaft but are induced by other fields. The stray field from the main magnetic field of the machine can produce an interference signal such as this.

In order to avoid measurement errors resulting from stray fields, the abovementioned "RARIC" appliance can be set such that suitable filtering ensures that only the third mains harmonic of the recorded signal is evaluated. The mains harmonics are in this case the signal components whose frequencies are an integer multiple of the fundamental mains frequency. This is based on the assumption that the interference fields dominantly have only the fundamental harmonic. The magnitude of these third harmonics is subjected to limit-value assessment.

However, in practice, it has been found that, despite filtering, the measurement is still highly susceptible to errors. The limit values are therefore set relatively high, in order to avoid false alarms. In order to avoid bearing damage, it should, however, be possible to reliably detect even small currents in the shaft.

SUMMARY

A method is disclosed for monitoring a shaft current and/or an insulation of a shaft of an electrodynamic machine during operation, comprising: measuring shaft voltage and an associated shaft current on the shaft; determining a relationship between the shaft voltage and the associated shaft current from measurement results for the shaft voltage and the shaft current for the electrodynamic machine; and monitoring the shaft voltage to monitor the shaft current in the electrodynamic machine, the shaft current to be monitored being deduced from the monitored shaft voltage based on the determined relationship between the shaft voltage and the associated shaft current.

An apparatus is disclosed for monitoring a shaft current and/or an insulation of a shaft of an electrodynamic machine during its operation, comprising: first means for inductive measurement of shaft current in a shaft of the electrodynamic machine, which means are connected to a processing unit; and second means for measurement of shaft voltage, the second means being connected to the processing unit.

BRIEF DESCRIPTION OF THE DRAWINGS

Exemplary embodiments will be explained in more detail in the following text with reference to exemplary embodiments shown in the drawings, in which.

DETAILED DESCRIPTION

Figure 1:
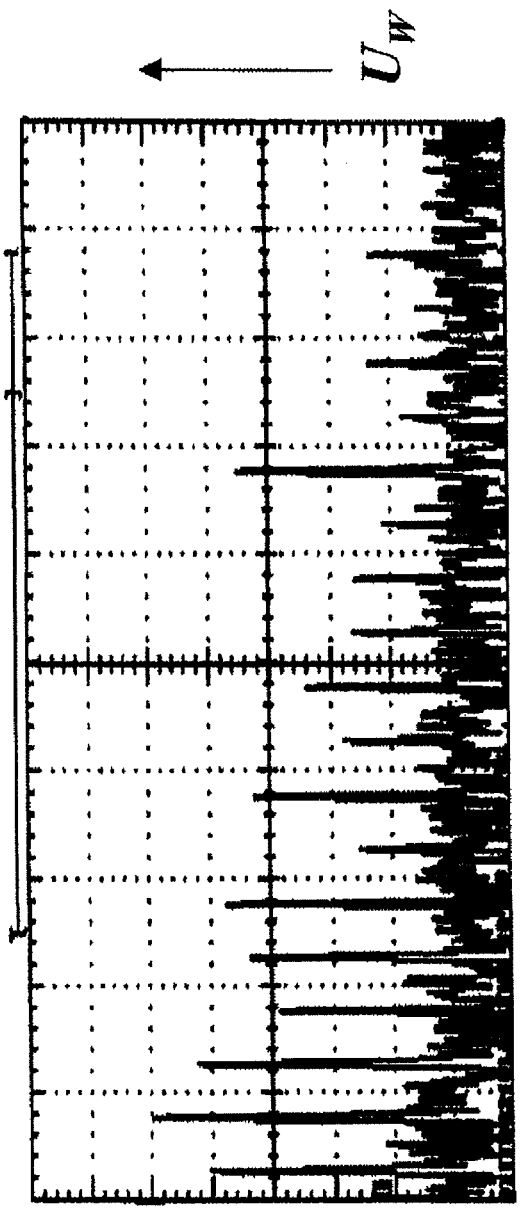
FIG. 1 shows an example of a measured frequency spectrum of a shaft voltage $U_w$, with the subdivision on the frequency axis being 200 Hz.

A method and an apparatus are disclosed in which the interference sensitivity of the shaft current measurement based on induction or Rogowski coils can be considerably reduced, and which allow more reliable and therefore also more sensitive measurement of the shaft currents using induction coils.

According to exemplary embodiments, the shaft voltage and the associated shaft current on the shaft are measured, and a relationship between the shaft voltage and the associated shaft current is determined from the measurement results for the shaft voltage and the shaft current for the electrodynamic machine. The shaft voltage can be monitored in order to monitor the shaft current in the electrodynamic machine, and the shaft current to be monitored can be deduced from the monitored shaft voltage on the basis of the determined relationship between the shaft voltage and the associated shaft current.

In this case, the shaft current is, for example, measured inductively on the shaft, to be precise by means of a Rogowski coil which is arranged around the shaft.

One exemplary refinement of the method is characterized in that the frequency spectra of the shaft voltage and of the associated shaft current are measured, and in that a transfer function $Z_w(j\omega)=U_w(j\omega)/I_w(j\omega)$ which can be interpreted as an impedance function of the shaft contact circuit is determined as a relationship between the shaft voltage and the associated shaft current and describes the relationship between the spectra of the shaft voltage and of the associated shaft current in the frequency domain.

For example, the structure of a resistive-inductive first-order low-pass filter can be used as the basis for simplified determination of the transfer function.

It is even simpler for a frequency-independent proportionality factor to be determined as the transfer function, which describes the relationship between the spectra of the shaft voltage and the associated shaft current in the lower frequency range of the electrodynamic machine.

One development of this method is distinguished in that an estimated shaft current can be calculated by means (e.g., a computer or processor) which use the proportionality factor from the measured shaft voltage, in that the root mean square value of the shaft current calculated in this way is determined, and in that the determined root mean square value is subjected to assessment by means for monitoring (e.g., a monitoring system having a computer or processor) which uses predetermined limit values in the course of the monitoring of the shaft current.

However, the proportionality factor can also be directly subjected to assessment by means which uses predetermined limit values in the course of the monitoring of the shaft current.

Another exemplary refinement is characterized in that in order to determine the proportionality factor, the individual proportionality factors of the odd-numbered harmonics of a fundamental frequency, in particular of the mains frequency, the shaft voltage and of the shaft current, are determined by division of amplitudes of the same order on the basis of the equation $Z_w(n\omega)=U_w(n\omega)/I_w(n\omega)$, and in that a resultant estimated proportionality factor is obtained from the set of individual proportionality factors by median formation or mean-value formation.

For example, the individual proportionality factors are determined up to a predetermined upper cut-off frequency, for example about 1000 Hz (or lesser or greater).

Another exemplary refinement of the disclosure is characterized in that the phase angles $\phi_z=\phi_u(n\omega)-\phi_I(n\omega)$ of the individual proportionality factors are determined, and in that the proportionality factors with phase angles which differ greatly from the values to be expected on the basis of a simple transfer function are excluded before median formation or mean-value formation.

A further exemplary refinement is characterized in that at a time at which it is known that the shaft is isolated such that no shaft currents flow, the signals from a measurement coil or Rogowski coil which is provided for the shaft current measurement are recorded, in that spectral lines which are injected from interference fields are determined by means (e.g., a computer or processor) which performs spectral analysis, and in that the individual proportionality factors which are associated with frequencies with dominant interference amplitude values are excluded from the set of individual proportionality factors before median formation.

Another exemplary refinement is distinguished in that spectra of the shaft voltage are measured without interference in different load states of the electrodynamic machine, only once, for example, when a monitoring system is started up, and the values are stored, in that the load state in which the electrodynamic machine is instantaneously located is determined during operation of the electrodynamic machine, and in that a data record which corresponds to this load state is then read, with the respectively applicable spectrum, from an internal memory.

An exemplary refinement of the apparatus is characterized in that the processing unit is designed to calculate the shaft current from the measured values for the shaft voltage, and in that a monitoring unit is connected to the output of the processing unit, in order to evaluate the results calculated by the processing unit.

Improved monitoring of the shaft current and of the insulation can in principle be achieved by assessing the measured signal, which characterizes the shaft current, on the basis of the spectrum of the shaft voltage.

Figure 3:
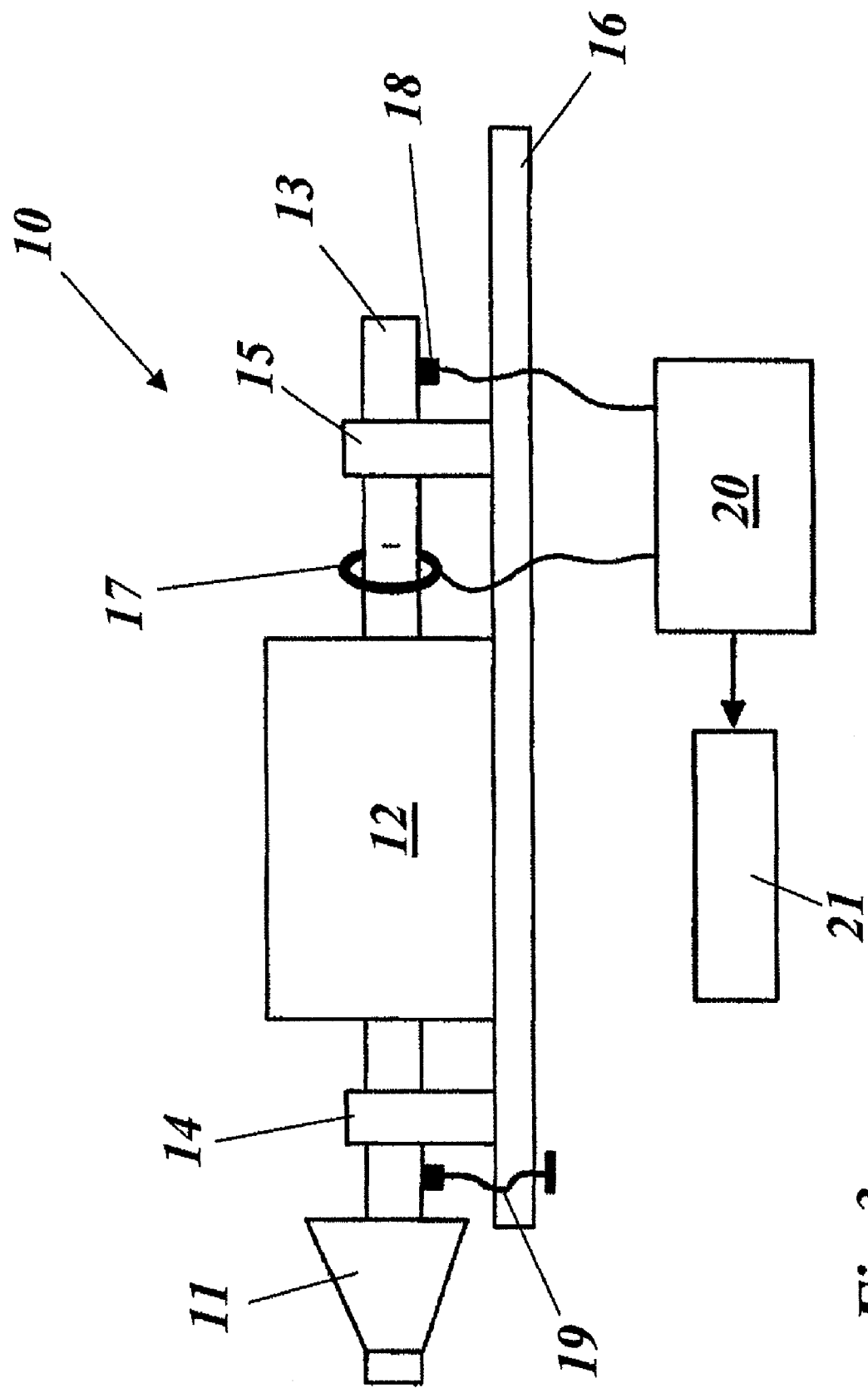
FIG. 3 shows a highly simplified schematic diagram of a monitoring apparatus according to an exemplary embodiment of the disclosure.

FIG. 3 illustrates an exemplary design of a basic arrangement which includes:

a generator 12 for producing electrical energy coupled by its shaft 13 to the turbine 11 of a gas-turbine or steam-turbine installation. The shaft 13 is borne at its two ends in appropriate bearings 14 and 15, which absorb both the weight of the rotor and axial thrust forces. The entire arrangement rests on a base plate 16. The shaft 18 is grounded via grounding 19 at one end (at the left in FIG. 3). At the other end, the shaft is borne in an isolated manner, in order to avoid shaft currents. This insulation and the shaft currents are monitored by a Rogowski coil 17 which is placed around the shaft 13 (in order to sense the magnetic fields associated with shaft currents) and a measurement brush 18 for tapping off the shaft voltage is provided.

An exemplary method is based on the knowledge that a primary reason for a possible shaft current is the shaft voltage which is induced in the loop between the shaft and the housing or ground. It is also known that every machine has an intrinsical shaft voltage which has a spectral structure which occurs only in that respective machine and depends on the operating rating point of the machine, that is to say for example it does not change over time. A further principle is that this shaft voltage can be determined with as little interference as possible.

Figure 2:
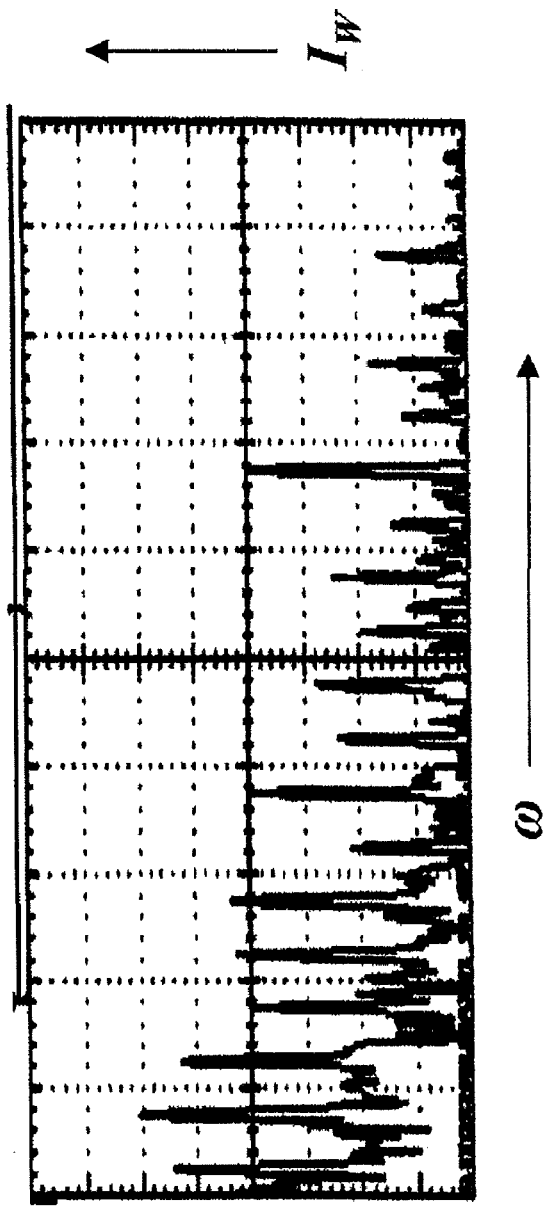
FIG. 2 shows the measured frequency spectrum of the shaft current $I_w$ associated with FIG. 1.

A further principle is the knowledge that the circuit in which the shaft current flows is largely resistive in the lower frequency range and, furthermore, acts resistively-inductively as a low-pass filter. This has been confirmed in measurements: for example, it has been found that the spectrum of the shaft current in the lower frequency range (up to about 500 Hz) is proportional, with an approximately constant factor, to the spectrum of the shaft voltage induced at this load point (see the two FIGS. 1 and 2). This proportionality factor can be interpreted as an impedance of the contact point, contact loop or entire loop.

A fundamental principle of an exemplary novel method disclosed herein is to determine the relationship between the shaft voltage and the measured shaft current. The shaft current can then be deduced on the basis of the relationship found, from the measurement result of the shaft voltage measurement, which can be subject to less interference.

In one exemplary embodiment, both the map of the shaft voltage and the measurement signal originating from the measurement coil are subjected to a frequency analysis, by means (e.g., a computer or processor) which performs Fourier transformation or by means of a plurality of bandpass filters, and the associated spectra are determined.

The fundamental frequency of the harmonic analysis of the two voltages is in this exemplary case the fundamental frequency of the mains voltage or the rotation frequency of the rotor, or integer multiples or factors thereof. However, an approximately continuous spectrum with a short line interval, can also be determined. The amplitude and phase spectra are, for example, determined.

Suitable filtering and estimation can then be carried out to find a transfer function which describes the relationship between the spectra of the shaft voltage and of the shaft current in the frequency domain. As is known, this transfer function indicates the amplitude ratio and the phase distortion between the shaft voltage and the shaft current, $Z_w(j\omega)=U_w(j\omega)/I_w(j\omega)$, and can be interpreted as an impedance function of the shaft contact circuit.

In order to estimate this transfer function, it is helpful to use physically predictable, possible and simple impedance structures. In one exemplary embodiment, the structure of a resistive-inductive first-order low-pass filter is chosen.

The knowledge that the spectrum of the shaft voltage has dominant amplitude values in the lower frequency range, which is generally lower than the cut-off frequency of the low-pass filter, allows a further simplification: in one embodiment, the task is reduced to the estimation of a single, frequency-independent proportionality factor, which describes the relationship between the shaft voltage spectrum and the shaft current spectrum in the lower frequency range.

This proportionality factor makes it possible to calculate an estimated shaft current from the shaft voltage, which can be recorded with only minor interference. The root mean square value of the estimated shaft current is then subjected to an assessment by means which establishes limit values. The root mean square value of the total current is in this case obtained, as normal by obtaining the square root of the sum of the squares of the amplitudes of the individual current harmonics.

However, advantageously, the proportionality factor, that is to say the contact resistance or isolation resistance, can also be subjected to an assessment directly. As soon as a limit value of the isolation resistance is undershot, a warning is emitted.

By way of example, the estimated proportionality value is determined by obtaining the individual proportionality factors of the odd-numbered mains harmonics of the shaft voltage and of the shaft current up to a frequency of about 1000 Hz by division of amplitudes of the same order: $Z_w(n\omega)=U_w(n\omega)/I_w(n\omega)$. A resultant, estimated factor is then obtained from the set of individual factors $\{Z_w(n\omega)\}$ obtained, for example by median formation or else mean-value formation. Median formation masks out, in terms of the result, measurement results from frequency ranges in which the interference signal occurs in an amplified form during the current measurement.

Furthermore, it is also possible to determine the phase angles $\phi_z=\phi_u(n\omega)-\phi_I(n\omega)$ of the individual impedance values, and to use them for interference suppression. In fact, a simple impedance function can be expected, for example that of a first-order low-pass filter. Impedance values with phase angles which differ to a major extent from the expected values corresponding to this function can be excluded. The median formation process can be then carried out, as described above.

Furthermore, the signals from the measurement coil can be recorded at a time at which it is known that the shaft is isolated such that no shaft currents are flowing. A spectral analysis then results in spectral lines which are injected from interference fields. The impedance values associated with frequencies with dominant interference amplitude values are then excluded from the set of impedance values. The median formation process is then carried out, as described above.

When determining the spectrum of the shaft voltage, it should be noted that the spectrum of the induced shaft voltage depends only (e.g., exclusively) on the respective load point, primarily on the real load point, of the machine, and that the spectrum in the upper load range even remains fairly constant. It is also known that the source impedance of the voltage source in the shaft voltage circuit is relatively low, as a result of which only a small voltage drop occurs up to relatively high shaft currents.

This knowledge makes it possible to measure the spectra of the shaft voltage in different load states only once, for example when starting up the monitoring system, optimally, that is to say without interference, and to store the values. During operation, the load state in which the machine is instantaneously being operated can be transmitted to the monitoring system. The monitoring system can then read a data record corresponding to this load state, with the respectively applicable spectrum, from an internal memory.

Because of the minor variants in the spectra, it is also possible to store only a small number of data records corresponding to the various load states, for example one for no load, one for half real load, and one for the rated real load. In the extreme, for example, only the spectrum for the rated load is stored. Since the shaft voltages were determined when the loop was on no load, the determined impedance then corresponds to the total impedance of the circuit.

Alternatively, the shaft voltage is also measured continuously or in parallel in time with the shaft current. This exemplary method can have the advantage that the results of a continuous measuring of the shaft voltage can also be used for other monitoring tasks, such as turn-short detection, vibration measurements, and so forth. In addition, the actual contact loop impedance is determined, since the voltage drop across the source impedance is also included in the calculation. This can, however, cause additional complexity for the measurement.

As already mentioned above, FIG. 3 shows a generator 12 with a shaft 13, turbine 11 and 2 bearings 14, 15. The shaft current is measured by means of a Rogowski coil 17, and the shaft voltage is measured at the non-drive end of the generator 12 via the measurement brush (sliding brush) 18. The shaft 13 is grounded on the drive side of the generator 12 (grounding 19). A processing unit 20 calculates the shaft current and the isolation resistance, and cyclically sends measured values to a connected monitoring unit 21, which operates as a monitoring and trending system.

In the calculation example in the following table, the dominant amplitudes of the current and voltage spectra are shown in the range up to 1350 Hz. The median of the impedance values is calculated, and the root mean square value of the estimated current.

| Frequency | Stored shaft voltage | Measured shaft current | Calculated resistance | Estimated current | Square of the current |
|---|---|---|---|---|---|
| 50 | 0.283 | 4.5 | 0.063 | 2.653125 | 7.039072 |
| 150 | 0.894 | 9.7 | 0.092 | 8.38125 | 70.24535 |
| 250 | 0.356 | 3.7 | 0.099 | 3.421875 | 11.70923 |
| 350 | 0.077 | 0.9 | 0.086 | 0.721875 | 0.521104 |
| 450 | 0.128 | 1.2 | 0.107 | 1.2 | 1.44 |
| 550 | 0.208 | 1.3 | 0.160 | 1.95 | 3.8025 |
| 650 | 0.017 | 0.1 | 0.170 | 0.159375 | 0.0254 |
| 750 | 0.119 | 0.8 | 0.149 | 1.115625 | 1.244619 |
| 1350 | 0.157 | 0.9 | 0.174 | 1.471875 | 2.166416 |
| | | | | | 98.19369 |
| | | Median | 0.107 | 9.909273001 | A rms |

Overall, exemplary embodiments can be distinguished by the following features:

Shaft current measured by means of a Rogowski coil is assessed and filtered on the basis of the shaft voltage, in order to improve the interference suppression.

The assessment is carried out in the frequency domain by means which assesses the current and voltage spectra (amplitude and phase spectra), with the amplitudes and phase angles of the harmonics of the same order being related to one another.

The ratios between associated voltage and current amplitudes and the corresponding phase differences are interpreted as impedance values.

Those values which probably have the least interference influence are selected by means which perform statistical assessment methods from the set of the impedance values determined in this way.

In an exemplary embodiment, the median of the amplitudes of the determined impedance values is selected for this purpose.

In a further exemplary embodiment, frequencies with a major interference influence are determined in the fault-free machine state, and corresponding impedance values are excluded from further calculation. By way of example, the median is selected from the remaining impedance values.

The selected impedance value then makes it possible to calculate an estimated shaft current spectrum from the shaft voltage spectrum by multiplication by the impedance value. The root mean square value of the shaft current can in turn be calculated from this.

Both the impedance value and the root mean square shaft current are subjected to an assessment by comparison with limit values.

The shaft voltage can also be measured simultaneously.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

| List of reference symbols | |
|---|---|
| 10 | Power station |
| 11 | Turbine |
| 12 | Generator |
| 13 | Shaft |
| 14, 15 | Bearing |
| 16 | Base plate |
| 17 | Rogowski coil |
| 18 | Measurement brush |
| 19 | Grounding |
| 20 | Processing unit |
| 21 | Monitoring unit |
| $U_W$ | Shaft voltage |
| $I_W$ | Shaft current |
| $\omega$ | Frequency |

What is claimed is:

1. A method for monitoring a shaft current and/or an insulation of a shaft of an electrodynamic machine during operation, comprising:
   measuring shaft voltage and an associated shaft current on the shaft;
   determining a relationship between the shaft voltage and the associated shaft current from measurement results for the shaft voltage and the associated shaft current for the electrodynamic machine via a transfer function; and
   monitoring the shaft voltage to monitor the associated shaft current in the electrodynamic machine, the associated shaft current to be monitored being calculated from the monitored shaft voltage based on the determined relationship between the shaft voltage and the associated shaft current.

2. The method as claimed in claim 1, wherein the shaft current is measured inductively on the shaft.

3. The method as claimed in claim 2, wherein the shaft current is measured by a Rogowski coil which is arranged around the shaft.

4. A method for monitoring a shaft current and/or an insulation of a shaft of an electrodynamic machine during operation, comprising:
   measuring shaft voltage and an associated shaft current on the shaft;
   determining a relationship between the shaft voltage and the associated shaft current from measurement results for the shaft voltage and the associated shaft current for the electrodynamic machine;
   monitoring the shaft voltage to monitor the associated shaft current in the electrodynamic machine, the associated shaft current to be monitored being deduced from the monitored shaft voltage based on the determined relationship between the shaft voltage and the associated shaft current;
   measuring the frequency spectra of the shaft voltage and of the associated shaft current; and
   determining a transfer function $Z_w(j\omega)=U_w(i\omega)/I_w(j\omega)$ which can be interpreted as an impedance function of the shaft contact circuit as a relationship between the shaft voltage and the associated shaft current ($I_w$) and which describes a relationship between spectra of the shaft voltage ($U_w$) and of the associated shaft current ($I_w$) in the frequency domain.

5. The method as claimed in claim 4, wherein the structure of a resistive-inductive first-order low-pass filter is used for simplified determination of the transfer function.

6. The method as claimed in claim 4, wherein a frequency-independent proportionality factor is determined as the transfer function, which describes the relationship between the spectra of the shaft voltage and the associated shaft current in the lower frequency range of the electrodynamic machine.

7. The method as claimed in claim 6, comprising:
   calculating an estimated shaft current using the proportionality factor from the measured shaft voltage; and
   calculating a root mean square value of the shaft current, the root mean square value being subjected to assessment using predetermined limit values in monitoring of the shaft current.

8. The method as claimed in claim 6, wherein the proportionality factor is directly subjected to assessment using predetermined limit values in monitoring of the shaft current.

9. The method as claimed in claim 6, comprising:
   determining the proportionality factor by determining individual proportionality factors of odd-numbered harmonics of a fundamental frequency of a mains frequency, the shaft voltage and of the shaft current, by division of amplitudes of a same order based on of the equation:

$Z_w(n\omega)=U_w(n\omega)/I_w(n\omega)$; and obtaining a resultant estimated proportionality factor from the individual proportionality factors $\{Z_w(n\omega)\}$ by median formation or mean-value formation.

10. The method as claimed in claim 9, wherein the individual proportionality factors are determined up to a predetermined upper cut-off frequency.

11. The method as claimed in claim 9, comprising:
determining phase angles $\phi_Z=\phi_U(n\omega)-\phi_I(n\omega)$ of the individual proportionality factors; and
excluding proportionality factors with phase angles which differ greatly from values to be expected based on a transfer function before median formation or mean-value formation.

12. The method as claimed in claim 9, comprising:
recording at a time at which it is known that the shaft is isolated such that no shaft currents flow, signals from a measurement coil or Rogowski coil which is provided for the shaft current measurement;
determining spectral lines injected from interference fields using a spectral analysis; and
excluding individual proportionality factors which are associated with frequencies with dominant interference amplitude values from the set of individual proportionality factors before median formation.

13. The method as claimed in claim 4, comprising:
measuring spectra of the shaft voltage without interference in different load states of the electrodynamic machine, at least once when a monitoring system is started, and storing values;
determining a load state in which the electrodynamic machine is instantaneously located during operation of the electrodynamic machine; and
reading a data record which corresponds to this load state, with a respectively applicable spectrum, from an internal memory.

14. A method for monitoring at least one of a shaft current and an insulation of a shaft of an electrodynamic machine during operation, comprising:
measuring shaft voltage and an associated shaft current on the shaft;
determining a relationship between the shaft voltage and the associated shaft current from measurement results for the shaft voltage and the shaft current for the electrodynamic machine; and
monitoring the shaft voltage to monitor the shaft current in the electrodynamic machine, the shaft current to be monitored being deduced from the monitored shaft voltage based on the determined relationship between the shaft voltage and the associated shaft current,
wherein determining the relationship between the measured shaft voltage and measured shaft current includes, relating to one another, amplitudes and phase angles of the harmonics of a same order in frequency spectra of the measured voltage and current.

15. The method of claim 14, comprising:
determining impedance values from voltage and current amplitude ratios and ratios of corresponding phase differences.

16. The method of claim 15, comprising:
selecting an impedance value;
calculating an estimated shaft current frequency spectrum from a product of a shaft voltage frequency spectrum and the selected impedance value; and
calculating a root mean square of the shaft current.

17. The method of claim 16, comprising:
comparing the selected impedance value and the root mean square of the shaft current with limit values.

* * * * *